(12) United States Patent
Yagyu et al.

(10) Patent No.: US 7,719,028 B2
(45) Date of Patent: May 18, 2010

(54) SEMICONDUCTOR LIGHT-RECEIVING DEVICE AND MANUFACTURING METHOD THEREOF

(75) Inventors: Eiji Yagyu, Tokyo (JP); Eitaro Ishimura, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/103,280

(22) Filed: Apr. 15, 2008

(65) Prior Publication Data

US 2008/0290369 A1 Nov. 27, 2008

(30) Foreign Application Priority Data

May 22, 2007 (JP) .............................. 2007-135018

(51) Int. Cl.
*H01L 31/0328* (2006.01)
(52) U.S. Cl. .................. 257/184; 257/225; 257/257; 257/290; 257/432; 257/E31.058
(58) Field of Classification Search ................. 257/184, 257/225, 257, 290, 432
See application file for complete search history.

(56) References Cited

U.S. PATENT DOCUMENTS 6,437,362 B2 * 8/2002 Suzuki ........................ 257/21

2006/0273421 A1 * 12/2006 Yasuoka et al. ............. 257/438

FOREIGN PATENT DOCUMENTS

| EP | 1 898 471 A1 | 3/2008 |
|---|---|---|
| JP | 4-332178 | 11/1992 |
| WO | WO 2004/100224 A2 | 11/2004 |
| WO | WO 2005/114712 A1 | 12/2005 |
| WO | WO 2006/123410 A1 | 11/2006 |

OTHER PUBLICATIONS

Hiroo Yonezu, "Optical Communication Device Engineering", Kougaku Tosho, 1984, p. 398 (Fig. 7.6) and p. 419 (Fig. 7.18).

* cited by examiner

*Primary Examiner*—Wai-Sing Louie
(74) *Attorney, Agent, or Firm*—Oblon, Spivak, McClelland, Maier & Neustadt, L.L.P.

(57) ABSTRACT

A semiconductor light-receiving device and its manufacturing method are provided which are capable of suppressing dark current and deterioration. Semiconductor crystals were sequentially grown over an n-type InP substrate, including an n-type InP buffer layer, an undoped GaInAs light absorption layer, an undoped InP diffusion buffer layer, and a p-type InP window layer. Next, a first mesa was formed by removing a part from the p-type InP window layer to the n-type InP buffer layer with a Br-based etchant having low etching selectivity, so as to form a sloped "normal" mesa structure. Next, a second mesa having a smaller diameter than the first mesa was formed by dry etching, by precisely removing a part from the p-type InP window layer to a certain mid position of the undoped InP diffusion buffer layer.

14 Claims, 4 Drawing Sheets

F I G. 3
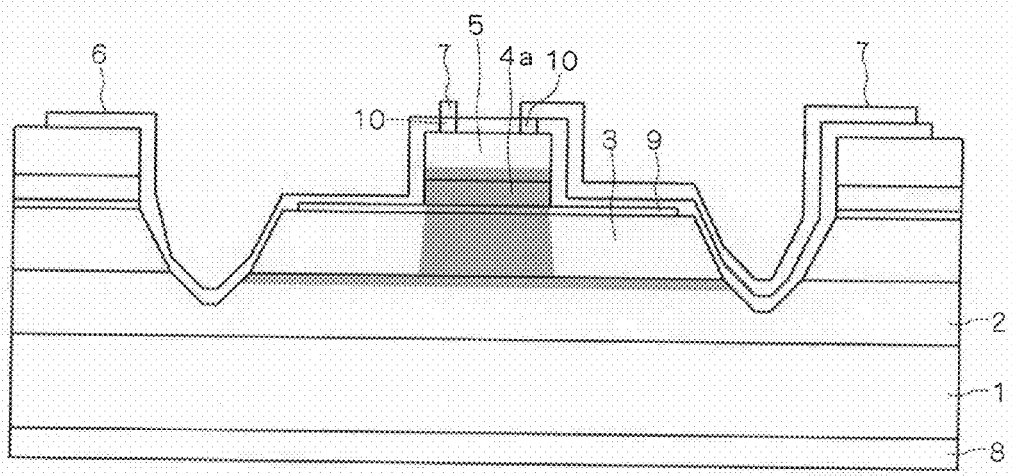
F I G. 4
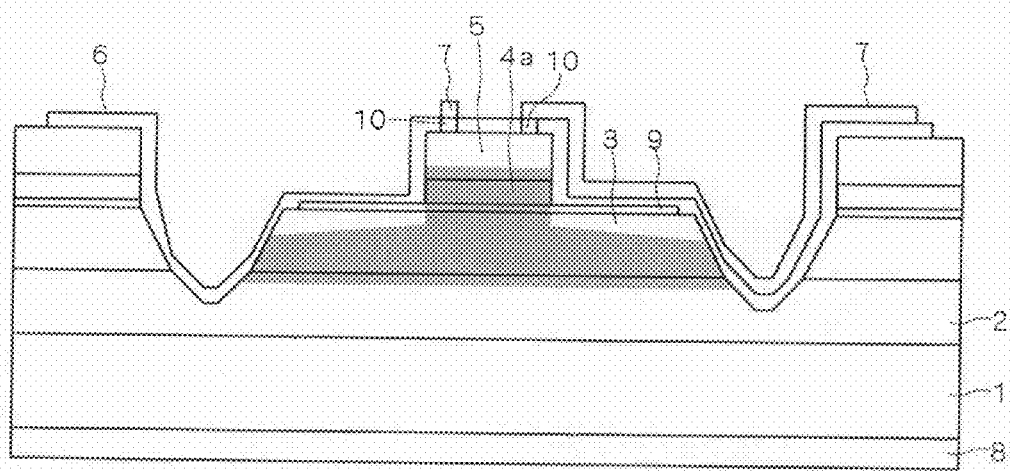

F I G . 7
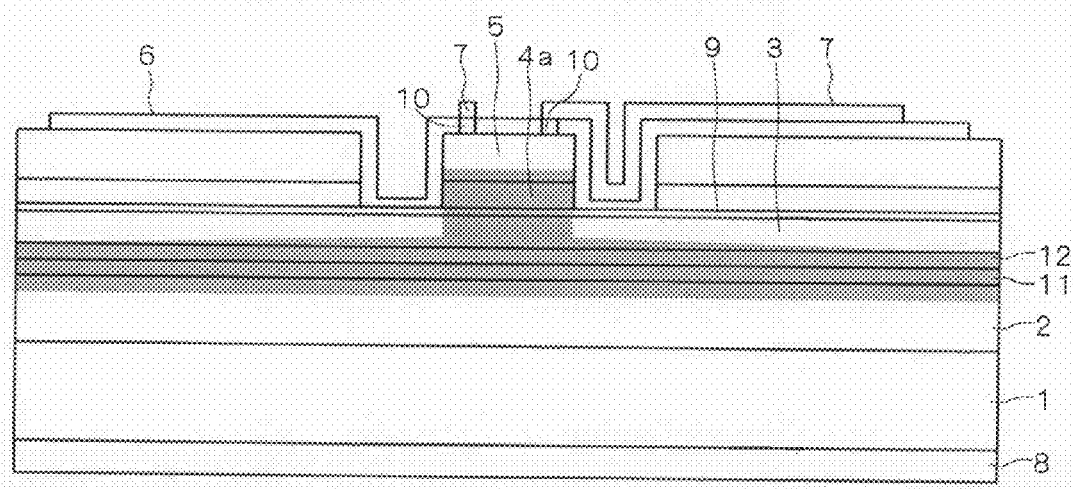
F I G . 8
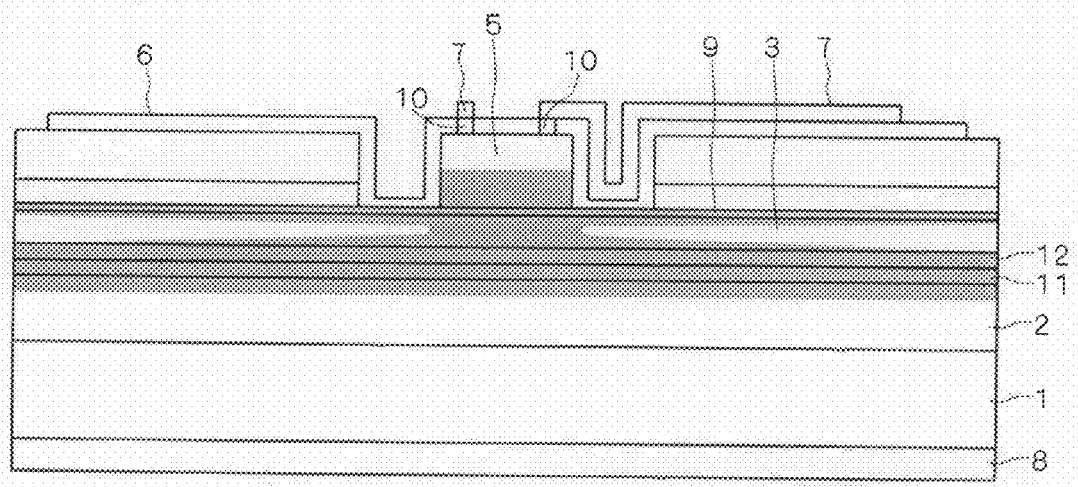

SEMICONDUCTOR LIGHT-RECEIVING DEVICE AND MANUFACTURING METHOD THEREOF

BACKGROUND OF THE INVENTION

1. Field of the Invention

The present invention relates to a semiconductor light-receiving device and a manufacturing method thereof, and particularly to a technique for suppressing dark current and deterioration.

2. Description of the Background Art

Conventionally, mesa-shaped semiconductor right-receiving devices have been in frequent use because they are easy to manufacture.

For example, in a conventional mesa photodiode (hereinafter "photodiode" will be referred to as PD), the mesa structure is formed by removing the part around the light-receiving portion, from a p-type semiconductor layer on the surface side to an n-type semiconductor layer on the substrate side, including an i-type light absorption layer. Furthermore, with this structure as a first mesa, a second mesa is formed by removing part of the material such that the mesa diameter of the p-type semiconductor layer and the mesa diameter of an upper part of the light absorption layer are smaller than the mesa diameter of the main part of the light absorption layer. By this, the depletion region in the light absorption layer is not exposed in the first mesa surface, and dark current and device capacitance are reduced (for example, see Japanese Patent Application Laid-Open No. 4-332178 (1992), which is hereinafter referred to as Patent Document 1). For such a PD, it is clear that a similar operation is achieved when the p and n conductivity types are used in a reverse manner.

Also, in a mesa avalanche photodiode (hereinafter "avalanche photodiode" will be referred to as APD), the area around the light-receiving portion is removed with a slope, including an n-type semiconductor layer on the surface side, a light absorption layer, and a pn junction surface of an avalanche multiplication layer under the light absorption layer, resulting in a sloped "normal" mesa structure in which the avalanche multiplication layer is larger than the light absorption layer (for example, see Hiroo Yonezu, "Optical Communication Device Engineering (Hikari Thuushin Soshi Kougaku)", Kougaku Tosho, p. 398 (FIGS. 7, 6), p. 419 (FIGS. 7, 18), 1984 (S. 59), which is hereinafter referred to as Non-Patent Document 1). With such an APD, it is clear that dark current and device capacitance can be reduced by forming a second mesa so that the mesa diameter of the n-type semiconductor layer is smaller than the mesa diameter of the light absorption layer, in a way similar to the formation of the PD of Patent Document 1. It is also clear that a similar operation is achieved when the p and n conductivity types are used in a reverse manner. When the avalanche multiplication layer is provided above the light absorption layer, the APD is shaped in a sloped "reverse" mesa so that the avalanche multiplication layer is larger, because it is preferable that the ionization rate of the carriers, i.e. electrons or holes, injected from the light absorption layer be higher than that of the other.

Also, planar light-receiving devices are in frequent use because they are highly stable. For example, in a conventional pseudo planar light-receiving device, the planar structure is achieved by forming a trench to isolate the light-receiving portion of a p-type semiconductor layer on the surface side, or by removing the part around the light-receiving portion (for example, see International Publication WO 2006/123410, which is hereinafter referred to as Patent Document 2).

With such semiconductor light-receiving devices, during the process of semiconductor crystal growth, the dopant used to give conductivity to the conductive semiconductor layer on the surface side thermally diffuses into the light absorption layer, and thus gives conductivity also to the light absorption layer. The presence of the conductive region diffused into the light absorption layer causes expansion of the depletion region occurring in the light absorption layer, and it is therefore necessary to remove the conductive region diffused into the light absorption layer so that the depletion region will not be exposed in the first mesa surface at all. As a result, the depletion region is exposed in the side surface of the second mesa, resulting in increased dark current.

Furthermore, the depletion region is exposed in the first mesa side surface and the second mesa top surface in the light absorption layer that has a small band gap, and therefore the device deteriorates from the exposed portion and fails to offer reliability. In particular, the deterioration from the mesa interface is especially serious in the case of APDs that involve generation of high electric fields.

SUMMARY OF THE INVENTION

An object of the present invention is to provide a semiconductor light-receiving device and a manufacturing method thereof that are capable of suppressing dark current and deterioration.

According to a first aspect of the present invention, a semiconductor light-receiving device includes a first-conductivity-type semiconductor substrate and semiconductor layers provided over the first-conductivity-type semiconductor substrate. The semiconductor layers include a first-conductivity-type layer, a light absorption layer, a diffusion buffer layer, and a second-conductivity-type layer that are disposed in this order. A first mesa is formed of a part at least including the light absorption layer in the semiconductor layers. Also, a second mesa having a smaller formation width than the first mesa is formed of a part at least including the diffusion buffer layer and the second-conductivity-type layer in the semiconductor layers.

The provision of the diffusion buffer layer prevents a depletion region in the light absorption layer from being exposed to the exterior. This suppresses dark current and deterioration.

According to a second aspect of the present invention, a semiconductor light-receiving device manufacturing method includes a step of preparing a first-conductivity-type semiconductor substrate, a step of forming semiconductor layers over the first-conductivity-type semiconductor substrate, a first mesa forming step, and a second mesa forming step. The semiconductor layers include a first-conductivity-type layer, a light absorption layer, a diffusion buffer layer for alleviating diffusion of second-conductivity-type carriers into the light absorption layer, and a second-conductivity-type layer that are disposed in this order. The first mesa forming step forms a first mesa composed of a part at least including the light absorption layer in the semiconductor layers. After the first mesa forming step, the second mesa forming step forms a second mesa having a smaller formation width than the first mesa, at least with the diffusion buffer layer and the second-conductivity-type layer in the semiconductor layers.

Dark current and deterioration are suppressed and a semiconductor light-receiving device with superior long-term stability is obtained.

According to a third aspect of the present invention, a semiconductor light-receiving device manufacturing method includes a step of preparing a first-conductivity-type semiconductor substrate, a step of forming semiconductor layers over the first-conductivity-type semiconductor substrate, and a second-conductivity-type layer removing step. The semiconductor layers include a first-conductivity-type layer, a light absorption layer, a diffusion buffer layer, and a second-conductivity-type layer that are disposed in this order. The second-conductivity-type layer removing step removes a part or entirety of an outer part of the diffusion buffer layer and the second-conductivity-type layer, leaving an inner part thereof as a light-receiving portion.

Device capacitance is reduced and an avalanche semiconductor light-receiving device with higher-speed response is obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross-sectional view illustrating a mesa PD according to a second preferred embodiment;

FIG. 4 is a cross-sectional view illustrating a mesa PD according to the second preferred embodiment;

FIG. 7 is a cross-sectional view illustrating a pseudo planar APD according to a fourth preferred embodiment; and FIG. 8 is a cross-sectional view illustrating a pseudo planar APD for comparison.

DESCRIPTION OF THE PREFERRED EMBODIMENTS

First Preferred Embodiment

Figure 1:
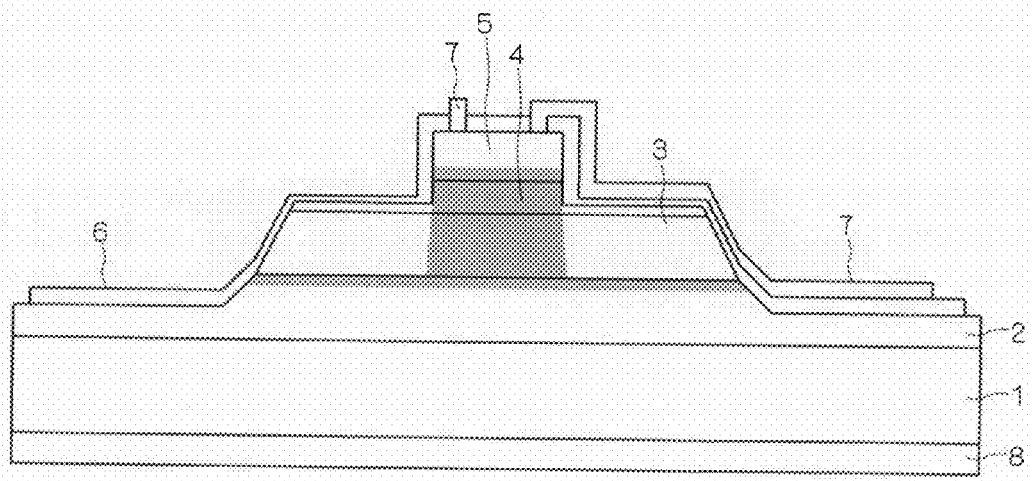
FIG. 1 is a cross-sectional view illustrating a mesa PD according to a first preferred embodiment.
Figure 2:
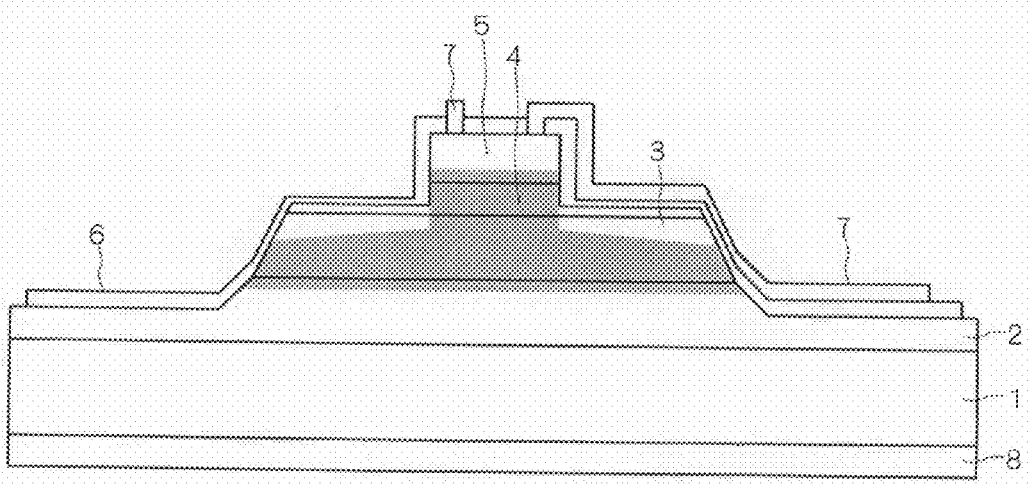
FIG. 2 is a cross-sectional view illustrating a mesa PD according to the first preferred embodiment.

FIGS. 1 and 2 are cross-sectional views illustrating mesa PDs according to a first preferred embodiment of the present invention. Now, a method for manufacturing the mesa PDs of FIGS. 1 and 2 will be described, where a first conductivity type is assumed to be n type, and a second conductivity type is assumed to be p type.

First, by various crystal growth techniques, semiconductor crystals (semiconductor layers) including an n-type InP buffer layer 2 (a first-conductivity-type layer), an undoped GaInAs light absorption layer 3 (a light absorption layer), an undoped InP diffusion buffer layer 4 (a diffusion buffer layer), and a p-type InP window layer 5 (a second-conductivity-type layer) were sequentially grown over an n-type InP substrate 1 (a first-conductivity-type substrate).

The semiconductor crystal growth techniques used include Liquid Phase Epitaxy (LPE) and Vapor Phase Epitaxy (VPE), and specifically include Metal Organic VPE (MO-VPE) and Molecular Beam Epitaxy (MBE), for example.

In order to give conductivity to group III-V semiconductor crystals, group II atoms such as Be, Mg, Zn and Cd are used as p-conductivity-type dopant, and group VI atoms such as S, Se and Te are used as n-conductivity-type dopant, and group IV atoms such as C, Si, Ge and Sn are used as amphoteric dopant that can act as dopant of either type depending on the semiconductor crystal. Group VIII atoms such as Fe and Ru, and Ti, act as insulating-type dopant that suppresses conductivity and provides an SI (Semi-Insulating) type.

In any of the growth techniques mentioned above, the semiconductor crystal is heated to extremely high temperatures at which reactions such as melting, thermal decomposition and dissociative adsorption occur, and therefore the dopant thermally diffuses to expand from the desired region. For example, Zn of about $10^{18}$ cm$^{-3}$ has a diffusion coefficient of $3\times10^{-13}$ cm$^2$/s at around 630° C., and the diffusion coefficient becomes larger and the diffusion expands in a larger area with increasing concentration and increasing temperature. Undoped semiconductor crystal not doped with any dopant is referred to as i-type (insulating-type) indicating an intrinsic semiconductor having no conductivity, but it is actually a p-type or n-type semiconductor that has a carrier concentration of $10^{16}$ cm$^{-3}$ or less.

Now, the layer thickness of the undoped InP diffusion buffer layer 4 is determined such that the carrier concentration of the p-type dopant diffusing from the p-type InP window layer 5 is $10^{17}$ cm$^{-3}$ or less in the undoped GaInAs light absorption layer 3, more preferably equal to the undoped level of $10^{16}$ cm$^{-3}$ or less.

That is, the undoped InP diffusion buffer layer 4 is a layer provided to alleviate the diffusion of the second conductivity type carriers from the p-type InP window layer 5 into the undoped GaInAs light absorption layer 3, and it has a larger band gap than the undoped GaInAs light absorption layer 3.

Next, as will be described below, the semiconductor crystal was subjected to processes such as lithographic mask formation, etching, and deposition, to form a mesa PD.

In this preferred embodiment, first, a first mesa was formed by removing a part from the p-type InP window layer 5 to the n-type InP buffer layer 2 with a Br-based etchant having low etching selectivity, resulting in a sloped "normal" mesa structure.

Next, a second mesa having a smaller formation width (which will hereinafter be referred to as a diameter) than the first mesa was formed by dry etching, by precisely removing a part from the p-type InP window layer 5 to a certain mid position of the undoped InP diffusion buffer layer 4.

Next, a SiNx protective layer 6 was formed, and then the SiNx protective layer 6 was removed in a ring-like form at the edge of the device and in a peripheral area on the light-receiving portion (on the p-type InP window layer 5), and a p-side electrode 7 was formed.

Next, the n-type InP substrate 1 was thinned by grinding and etching, and an n-side electrode 8 was formed, which was followed by sintering to make ohmic contacts between semiconductor and metal (i.e. between the p-type InP window layer 5 and the p-side electrode 7, and between the n-type InP substrate 1 and the n-side electrode 8).

Finally, the n-type InP substrate 1 was divided by cleavage, so as to obtain a PD 0.2 mm to 0.3 mm square.

According to the structure of this preferred embodiment, as shown in FIGS. 1 and 2, the depletion region (the hatched region) in the first and second mesas is exposed to the exterior (the mesa interface) not in the undoped GaInAs light absorption layer 3 but in the undoped InP diffusion buffer layer 4 (the second mesa side surface) that has a larger band gap. Now, FIG. 1 illustrates a structure in which the undoped GaInAs light absorption layer 3 is n type, and FIG. 2 illustrates a structure in which the undoped GaInAs light absorption layer 3 is p type. The lattice structure is considerably changed at the mesa interface. Accordingly, when the depletion region is exposed to the mesa interface, it is likely to cause dark current and deterioration, and such problems are severer when the band gap of the semiconductor crystal is smaller. Thus, dark current and deterioration can be suppressed and a PD with superior long-term stability can be achieved by structuring the device in such a manner that the depletion region is not exposed in the undoped GaInAs light absorption layer 3 but the depletion layer is exposed only in the undoped InP diffusion buffer layer 4 having a larger band gap.

The undoped InP diffusion buffer layer 4 is not limited to an undoped layer, but it may be an intentionally doped p-type, n-type or SI-type layer. When it is p type, the same effects are obtained when the carrier concentration is not more than that of the p-type InP window layer 5 ($10^{17}$ cm$^{-3}$ or less), or more preferably equal to the undoped level of $10^{16}$ cm$^{-3}$ or less. When it is n type or SI type, it and the diffusing p-type dopant cancel each other out, allowing the undoped InP diffusion buffer layer 4 to be formed thinner. This shortens the carrier transit time and offers a PD with higher-speed response. The carrier concentration of n-type or SI-type can be set approximately equal to that of the diffusing p-type dopant, and preferably, it can be at least $10^{15}$ cm$^{-3}$ or more for n type, or more preferably equal to the undoped level of $10^{16}$ cm$^{-3}$ or more, or still more preferably $10^{17}$ cm$^{-3}$ or more in order to counteract the diffusing p-type dopant.

Also, the undoped InP diffusion buffer layer 4 is not limited to a single layer, but it can be composed of a plurality of layers, and the conductivity type and carrier concentration can be varied for each layer. Also, as mentioned above, the undoped InP diffusion buffer layer 4 has a larger band gap than the undoped GaInAs light absorption layer 3, and the crystal composition of each layer of the undoped InP diffusion buffer layer 4 may be sequentially varied so that the band gap gradually increases with increasing distance from the undoped GaInAs light absorption layer 3, so as to suppress standstill of the carriers flowing from the undoped GaInAs light absorption layer 3 at the hetero-interface. This offers higher-output and higher-speed operation. In this preferred embodiment, the gap of the valence band is made smaller because holes flow as carriers. For example, it can be achieved by changing the composition from the undoped GaInAs light absorption layer 3 side to the p-type InP window layer 5 side, from GaInAs to InP through GaxInl1-xAsyInP1-y. This specification does not describe detailed compositions, but group III atoms and group V atoms are in a ratio of 1:1. That is, InP is In0.5P0.5, and GaInAs having a crystal lattice constant matched to InP is Ga0.47In0.53As1.0. Thus, in the GaxIn1-xAsyInP1-y as mixed crystal of GaAs, InAs and InP, InP corresponds to x=0 and y=0, and GaInAs that is lattice-matched to InP cannot take arbitrary values of x and y but Ga=0.47 and As=1.

After the formation of the second mesa, p-type dopant may be diffused intentionally. For example, p-type dopant was diffused from the p-type InP window layer 5 into the undoped InP diffusion buffer layer 4, while heating from 450° C. to 700° C., or heating appropriately at 500° C. herein. In this case, the p-type dopant diffuses from the second mesa, and the undoped InP diffusion buffer layer 4 is made p-type, but the diffusion region is approximately equal to the second mesa diameter and does not greatly expand. Thus, the carrier transit time can be shortened without deteriorating dark current characteristics and reliability, allowing higher-speed response.

Second Preferred Embodiment

FIGS. 3 and 4 are cross-sectional views illustrating mesa PDs according to a second preferred embodiment of the invention. The structures of FIGS. 3 and 4 are different respectively from those of FIGS. 1 and 2 in that an undoped AlInAs diffusion buffer layer 4a is provided in place of the undoped InP diffusion buffer layer 4, and an undoped InP protective layer 9 is provided between the undoped GaInAs light absorption layer 3 and the undoped AlInAs diffusion buffer layer 4a, and a p-type GaInAs contact layer 10 is provided on the p-type InP window layer 5. The undoped InP protective layer 9 is provided to protect the undoped GaInAs light absorption layer 3 from etching. The undoped InP protective layer 9 has a different composition from the undoped AlInAs diffusion buffer layer 4a and has a larger diameter than the undoped AlInAs diffusion buffer layer 4a, and it has a larger band gap than the undoped GaInAs light absorption layer 3, like the undoped InP diffusion buffer layer 4. In the structures of FIGS. 3 and 4, as compared with those of FIGS. 1 and 2, the shape of the undoped GaInAs light absorption layer 3 around the edge of the device differs because of the provision of the undoped InP protective layer 9.

In FIGS. 3 and 4, the same components as those of FIGS. 1 and 2 are denoted by the same reference characters and are not described in detail again here. A method for manufacturing the mesa PDs of FIGS. 3 and 4 will now be described.

First, as in the first preferred embodiment, the semiconductor crystals were sequentially grown over an n-type InP substrate 1 by various crystal growth techniques. In this process, the undoped InP protective layer 9 was grown after the growth of the undoped GaInAs light absorption layer 3 and before the growth of the undoped AlInAs diffusion buffer layer 4a, and the p-type GaInAs contact layer 10 was grown after the growth of the p-type InP window layer 5.

Now, the layer thickness of the undoped AlInAs diffusion buffer layer 4a is determined such that the carrier concentration of the p-type dopant diffusing from the p-type InP window layer 5 is $10^{17}$ cm$^{-3}$ or less in the undoped InP protective layer 9, more preferably equal to the undoped level of $10^{16}$ cm$^{-3}$ or less.

Next, as will be described below, the semiconductor crystals were subjected to processes such as lithographic mask formation, etching, and deposition, so as to manufacture a mesa PD.

In this preferred embodiment, first, the p-type GaInAs contact layer 10 was formed in a ring-like form in a peripheral area on the light-receiving portion, and a second mesa was formed by removing a part from the p-type InP window layer 5 to the undoped AlInAs diffusion buffer layer 4a. In this process, by using a selective etching technique with a different etching rate for each semiconductor crystal layer, the p-type InP window layer 5 and the undoped AlInAs diffusion buffer layer 4a were removed by etching, while the undoped InP protective layer 9 remained almost unetched and its layer thickness remained almost unchanged from when it was formed by crystal growth.

Next, a first mesa was formed by removing a part from the p-type InP window layer 5 to the n-type InP buffer layer 2 with a Br-based etchant having low etching selectivity, resulting in a sloped "normal" mesa structure.

Next, a SiNx protective layer 6 was formed, and the SiNx protective layer 6 was removed in a ring-like form at the edge of the device and in a peripheral area on the light-receiving portion (on the p-type GaInAs contact layer 10), and a p-side electrode 7 was formed.

Next, as in the first preferred embodiment, the n-type InP substrate 1 was thinned by grinding and etching, and an n-side electrode 8 was formed, which was followed by sintering to make ohmic contacts between semiconductor and metal (i.e. between the p-type InP window layer 5 and the p-side electrode 7, and between the n-type InP substrate 1 and the n-side electrode 8).

Finally, as in the first preferred embodiment, the n-type InP substrate 1 was divided by cleavage, so as to obtain a PD 0.2 mm to 0.3 mm square.

According to the structure of this preferred embodiment, as shown in FIGS. 3 and 4, the undoped GaInAs light absorption layer 3 is protected by the undoped InP protective layer 9 that is not significantly reduced by the selective etching, whereby the undoped GaInAs light absorption layer 3 is prevented from being etched during the removal of the undoped AlInAs diffusion buffer layer 4a. Accordingly, the first and second mesas can be formed more certainly than in the first preferred embodiment. This makes it possible to easily achieve a mesa PD with further reduced dark current and further reduced deterioration, as compared with the first preferred embodiment.

The conductivity type, carrier concentration, and composition of the undoped InP protective layer 9 may be varied in a manner as described in the first preferred embodiment about the undoped InP diffusion buffer layer 4. That is, the undoped InP protective layer 9 may be p type (with a carrier concentration not more than that of the p-type InP window layer 5), or n type, or SI type, and its crystal composition may be sequentially changed such that the band gap gradually increases with increasing distance from the undoped GaInAs light absorption layer 3.

Third Preferred Embodiment

The first and second preferred embodiments have described mesa PDs, but mesa APDs can be manufactured by adding an avalanche multiplication layer.

Figure 5:
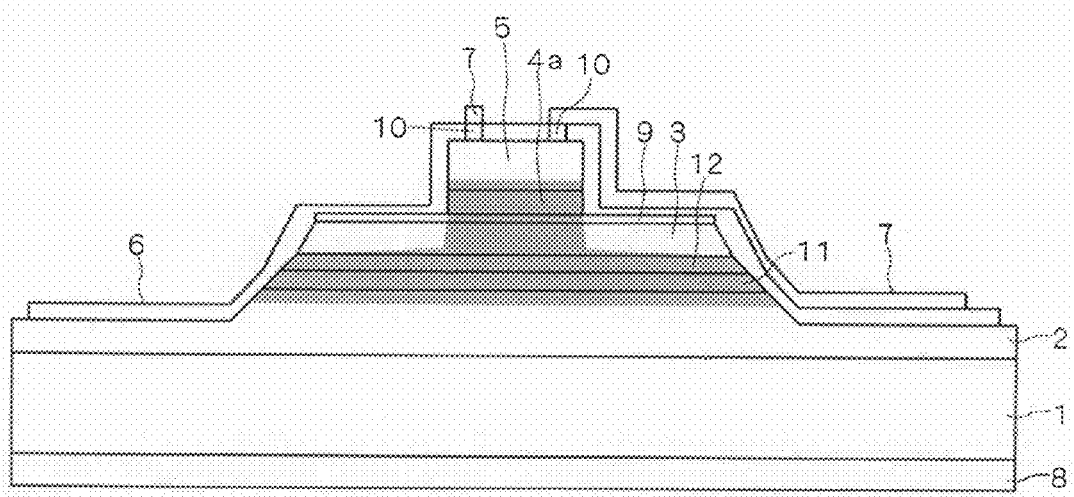
FIG. 5 is a cross-sectional view illustrating a mesa APD according to a third preferred embodiment.

FIG. 5 is a cross-sectional view illustrating a mesa APD according to a third preferred embodiment of the invention. The structure of FIG. 5 differs from that of FIG. 3 in that an undoped AlInAs avalanche multiplication layer 11 and a p-type InP electric-field alleviating layer 12 are provided between the n-type InP buffer layer 2 and the undoped GaInAs light absorption layer 3.

In FIG. 5, the same components as those of FIG. 3 are denoted by the same reference characters and are not described in detail again here. A method for manufacturing the mesa APD of FIG. 5 will now be described.

First, as in the second preferred embodiment, semiconductor crystals were sequentially grown over an n-type InP substrate 1 by various crystal growth techniques. In this process, the undoped AlInAs avalanche multiplication layer 11 and the p-type InP electric-field alleviating layer 12 were sequentially grown after the growth of the n-type InP buffer layer 2 and before the growth of the undoped GaInAs light absorption layer 3.

Then, processes as described in the second preferred embodiment were performed to form an APD.

In contrast with the Separate Absorption and Multiplication (SAM) structure, an APD structure having such a p-type InP electric-field alleviating layer 12 is known as Separate Absorption, Charge and Multiplication (SACM) structure or Lo-Hi-Lo structure, which allows effective distribution of electric-field strengths in individual layers and thus offers superior characteristics.

According to the structure of this preferred embodiment, as shown in FIG. 5, the depletion region (the hatched region) in the first and second mesas is exposed to the exterior not in the undoped GaInAs light absorption layer 3 but in the undoped AlInAs diffusion buffer layer 4a (the second mesa side surface) that has a larger band gap. Consequently, as in the first preferred embodiment, dark current and deterioration are suppressed and an APD with superior long-term stability is achieved.

Figure 6:
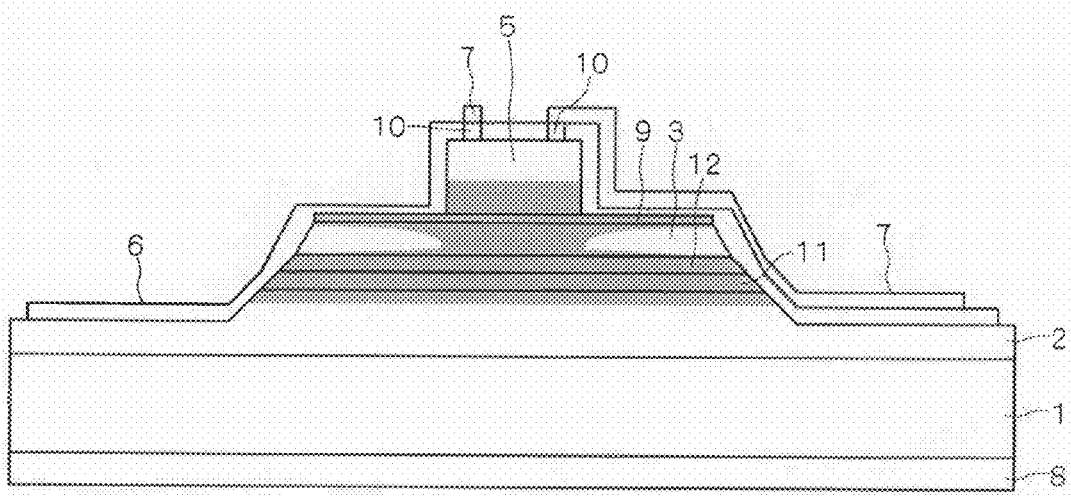
FIG. 6 is a cross-sectional view illustrating a mesa APD for comparison.

For comparison, FIG. 6 illustrates a cross-sectional view of a mesa APD that does not have the undoped AlInAs diffusion buffer layer 4a. In the APD of FIG. 6, the second mesa is formed by removing a portion to the p-type InP window layer 5. In this case, the dopant diffuses from the p-type InP window layer 5 into the undoped InP protective layer 9, and further into the undoped GaInAs light absorption layer 3. Accordingly, as shown in FIG. 6, the depletion region in the undoped GaInAs light absorption layer 3 expands and is exposed to the exterior. This causes increased dark current and deterioration. Alternatively, in order to prevent the exposure of the depletion layer in the undoped GaInAs light absorption layer 3, it is necessary to make the first mesa larger (deeper), resulting in an increase in size.

The structure of this preferred embodiment suppresses dark current and deterioration and achieves an APD with superior long-term stability, without a need to increase the size. Also, the structure achieves reduced device capacitance and realizes an APD with higher-speed response.

Fourth Preferred Embodiment

The third preferred embodiment has described a mesa APD. However, not only a mesa APD but also a pseudo planar APD can be manufactured.

FIG. 7 is a cross-sectional view illustrating a pseudo planar APD according to a fourth preferred embodiment of the present invention.

In FIG. 7, the same components as those of FIG. 5 are denoted by the same reference characters and are not described in detail again here. A method for manufacturing the planar APD of FIG. 7 will now be described.

First, as in the third preferred embodiment, the semiconductor crystals were sequentially grown over an n-type InP substrate 1 by various crystal growth techniques.

Next, as will be described below, the semiconductor crystals were subjected to processes such as lithographic mask formation, etching, and deposition, so as to manufacture a pseudo planar APD.

In this preferred embodiment, first, a ring-shaped trench was formed by selective etching, from the p-type InP window layer 5 to reach the undoped InP protective layer 9, so as to form and isolate the light-receiving portion.

Next, a p-type GaInAs contact layer 10 was formed in a ring-like form in a peripheral area on the light-receiving portion.

Next, a SiNx protective layer 6 was formed, and the SiNx protective layer 6 was removed in a ring-like form at the edge of the device and in a peripheral area on the light-receiving portion (on the p-type GaInAs contact layer 10), and a p-side electrode 7 was formed.

Next, as in the second and third preferred embodiments, the n-type InP substrate 1 was thinned by grinding and etching, and an n-side electrode 8 was formed, which was followed by sintering to make ohmic contacts between semiconductor and metal (i.e. between the p-type InP window layer 5 and the p-side electrode 7, and between the n-type InP substrate 1 and the n-side electrode 8).

Finally, as in the second and third preferred embodiments, the n-type InP substrate 1 was divided by cleavage, so as to obtain an APD 0.2 mm to 0.3 mm square.

For comparison, FIG. 8 illustrates a cross-sectional view of a pseudo planar APD that does not have the undoped AlInAs diffusion buffer layer 4a. In the APD of FIG. 8, the dopant diffuses from the p-type InP window layer 5 into the undoped GaInAs light absorption layer 3 (or the undoped InP protective layer 9), and provides p-type conductivity to the undoped GaInAs light absorption layer 3. This causes expansion of the depletion region in the undoped GaInAs light absorption layer 3, as shown in FIG. 8.

According to the structure of the this preferred embodiment, as shown in FIG. 7, the provision of the undoped AlInAs diffusion buffer layer 4a prevents the depletion region from being exposed to the exterior in the undoped GaInAs light absorption layer 3, and also narrows the depletion region. This suppresses dark current and deterioration, and achieves an APD with superior long-term stability. Also, this reduces device capacitance and achieves an APD with higher-speed response.

The description above has illustrated isolation and formation of the light-receiving portion by forming a ring-shaped trench in the p-type InP window layer 5 and the undoped AlInAs diffusion buffer layer 4a. However, this scheme has been illustrated by way of example, and the light-receiving portion may be formed by removing the p-type InP window layer 5 and the undoped AlInAs diffusion buffer layer 4a in the entire area outside the trench. That is, when the inner part of the p-type InP window layer 5 and the undoped AlInAs diffusion buffer layer 4a is formed as the light-receiving portion, the outer part may be removed only partially, or may be removed entirely. Also, after the formation of the light-receiving portion, thermal processing may be performed as described in the first preferred embodiment, in order to intentionally diffuse p-type dopant from the p-type InP window layer 5 into the undoped AlInAs diffusion buffer layer 4a.

Also, as in conventional techniques (for example, as in Patent Document 2), it is possible to reduce dark current by slightly removing the GaInAs light absorption layer by applying etching to a cleavage-separated side surface, or to a side surface of a blind hole formed to surround the p-type InP window layer 5 to reach a lower portion of the GaInAs light absorption layer.

Also, the description above has described a pseudo planar APD having the undoped AlInAs avalanche multiplication layer 11 and the p-type InP electric-field alleviating layer 12, but not only APDs but also pseudo planar PDs can be manufactured by omitting the undoped AlInAs avalanche multiplication layer 11 and the p-type InP electric-field alleviating layer 12.

Thus, semiconductor light-receiving devices including PDs and APDs of mesa-type and planar-type have been described referring to the four preferred embodiments. However, it is clear that a layered structure, thicknesses of individual layers, carrier concentrations, manufacturing schemes and the like illustrated in one preferred embodiment, except those unique to particular semiconductor light-receiving devices, are applicable also to semiconductor light-receiving devices of other preferred embodiments, and the same effects are obtained by the applications.

While the invention has been described in detail, the foregoing description is in all aspects illustrative and not restrictive. It is understood that numerous other modifications and variations can be devised without departing from the scope of the invention.

What is claimed is:

1. A semiconductor light-receiving device comprising:
a first-conductivity-type semiconductor substrate; and
semiconductor layers provided over said first-conductivity-type semiconductor substrate, said semiconductor layers including a first-conductivity-type layer, a light absorption layer, a diffusion buffer layer, and a second-conductivity-type layer that are disposed in this order,
with a first mesa being formed of a part at least including said light absorption layer in said semiconductor layers, and
with a second mesa being formed of a part at least including said diffusion buffer layer and said second-conductivity-type layer in said semiconductor layers, said second mesa having a smaller formation width than said first mesa, and said first mesa and said second mesa each having a side surface portion and a top surface portion which are not parallel to each other.

2. The semiconductor light-receiving device according to claim 1, wherein said diffusion buffer layer is composed of a composition change layer, and has a band gap that increases with increasing distance from said light absorption layer.

3. The semiconductor light-receiving device according to claim 1, wherein said diffusion buffer layer is composed of a plurality of layers, and has a band gap that increases with increasing distance from said light absorption layer.

4. The semiconductor light-receiving device according to claim 1, further comprising a protective layer provided between said light absorption layer and said diffusion buffer layer, said protective layer having a different composition from said diffusion buffer layer, having a larger formation width than said diffusion buffer layer, and having a larger band gap than said light absorption layer.

5. The semiconductor light-receiving device according to claim 4, wherein said protective layer is composed of a composition change layer, and has a band gap that increases with increasing distance from said light absorption layer.

6. The semiconductor light-receiving device according to claim 4, wherein said protective layer is composed of a plurality of layers, and has a band gap that increases with increasing distance from said light absorption layer.

7. The semiconductor light-receiving device according to claim 1, wherein said diffusion buffer layer has the second conductivity type and has a lower carrier concentration than said second-conductivity-type layer.

8. The semiconductor light-receiving device according to claim 1, wherein said diffusion buffer layer has the first conductivity type.

9. The semiconductor light-receiving device according to claim 1, wherein said diffusion buffer layer has an insulating type.

10. The semiconductor light-receiving device according to claim 4, wherein said protective layer has the second conductivity type and has a lower carrier concentration than said second-conductivity-type layer.

11. The semiconductor light-receiving device according to claim 4, wherein said protective layer has the first conductivity type.

12. The semiconductor light-receiving device according to claim 4, wherein said protective layer has an insulating type.

13. The semiconductor light-receiving device according to claim 1, further comprising a protective layer provided between said light absorption layer and said diffusion buffer layer, said protective layer being composed of a composition change layer.

14. The semiconductor light-receiving device according to claim 1, further comprising a protective layer provided between said light absorption layer and said diffusion buffer layer, said protective layer being composed of a plurality of layers.

* * * * *